Oct. 17, 1961 E. J. MARTIN ET AL 3,005,114
POWER SWITCHING DEVICE
Filed Nov. 9, 1959
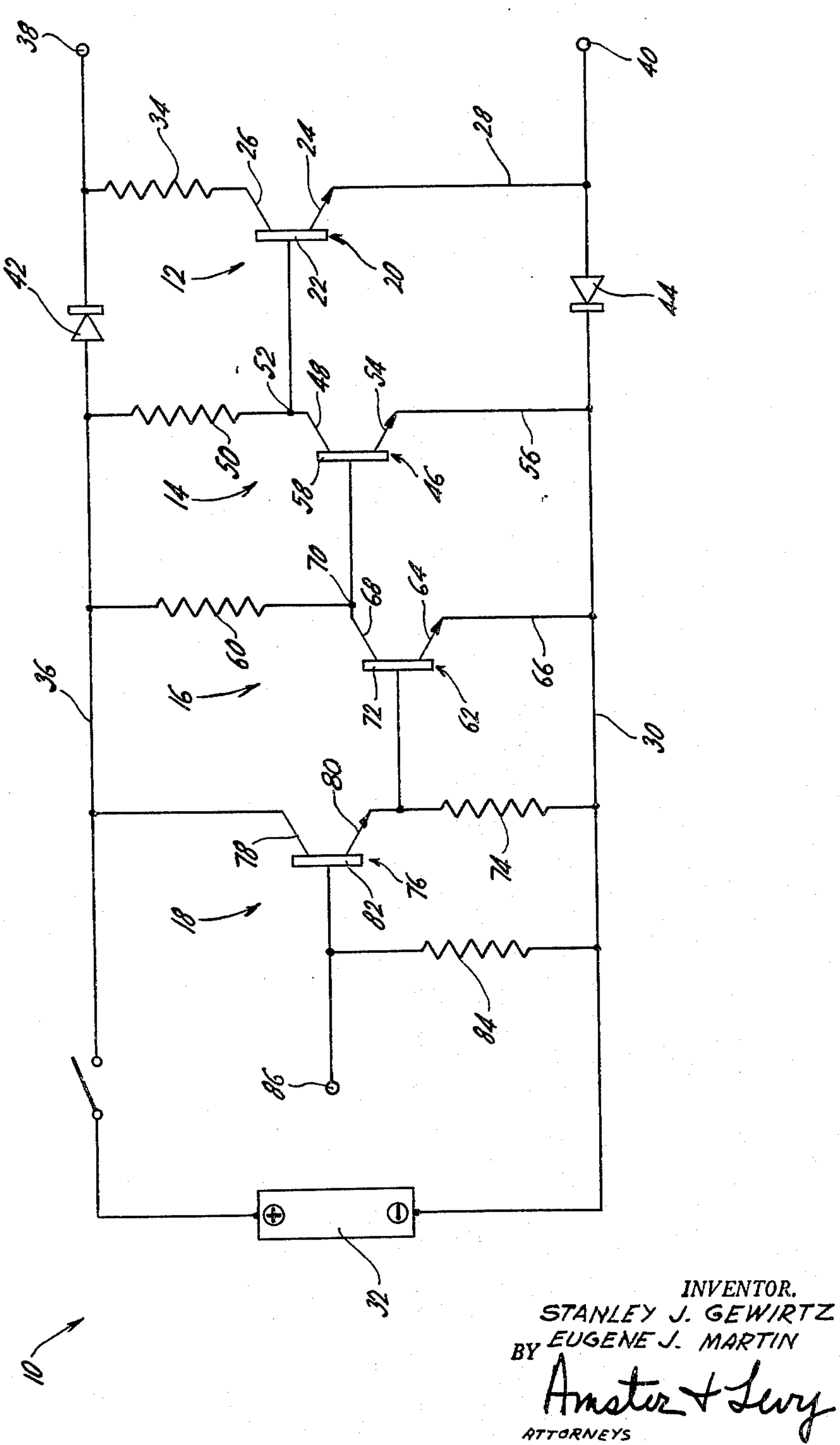
INVENTOR.
STANLEY J. GEWIRTZ
EUGENE J. MARTIN
BY Amster + Levy
ATTORNEYS United States Patent Office 3,005,114
Patented Oct. 17, 1961

3,005,114
POWER SWITCHING DEVICE
Eugene J. Martin, 49 Bruce Lane, Westbury, N.Y., and Stanley J. Gewirtz, 435 W. 119th St., New York, N.Y.
Filed Nov. 9, 1959, Ser. No. 851,666
4 Claims. (Cl. 307—88.5)

The present invention relates generally to an improved direct coupled transistor amplifier, and in particular to an improved power switching device suitable for the rapid switching of direct and alternating current.

Presently available switching devices have been found to suffer from a number of characteristic disadvantages, resulting either from the circuitry and/or the type of componets employed. Among these disadvantages are lack of total temperature stability over the operating ranges encountered in use, the inability to withstand rather high vibration and shock, and the initial high cost of assembly, due in part to the extensive need for hand labor and the necessity for precision adjustment and testing. With the advent of transistors many of these problems can be overcome in that it is possible to provide exceptionally rugged units; but the use of transistors presents still further problems.

Broadly it is an object of the present invention to provide an improved transistorized power switching device. Specifically it is within the contemplation of the present invention to provide an improved power switching means which exhibits a high order of reliability and accuracy over encountered operating ranges, which is relatively rugged and is capable of withstanding high orders of vibration and shock and which can be manufactured at relatively low unit cost.

In accordance with an illustrative embodiment demonstrating features and advantages of the present invention, there is provided a power switching device which comprises first and second transistors each including a base, an emitter and a collector. A source of direct current potential is connected at one side to the collector of the first stage, and a degenerating impedance connects the emitter of the first stage to the other side of the source. Provision is made for biasing the first stage and signal input means is connected to the base of the first stage. The second stage is connected to one side of the source by a biasing resistance with the other side of the source being connected to the emitter of the second stage. The base of the second stage is connected to the emitter of the first stage such that the second stage provides an infinitely high impedance shunting the degenerating impedance. Thus, signal input to the first stage initially causes a light conduction and then causes an avalanche effect, bringing about heavy conduction in the emitter-collector circuit of the second stage. A switching arrangement is connected to the output of the second stage and is responsive only to the heavy conduction.

As a feature of the invention, the switching arrangement comprises a third transistor stage having an emitter, collector and base. Provision is made for biasing the third transistor stage for forward conduction and for grounding one of the emitter or collector of the third transistor stage. A load is connected to the ungrounded one of the emitter and collector to a source of power to be switched. Means are connected to the base of the third transistor stage and to its biasing means for providing a low impedance clamp to ground for the base for neutralizing the forward bias from the biasing means and for neutralizing leakage current in the load until such time as the switching arrangement responds to the heavy conduction.

The above brief description, as well as other objects, features and advantages of the present invention will be more fully appreciated by reference to the following detailed description of an illustrative embodiment according to the invention, when taken in conjunction with the single figure of the drawings, which is a schematic diagram of an illustrative power switching device in accordance with the present invention.

Referring now specifically to the schematic diagram, there is shown a direct coupled amplifier, generally designated by the reference numeral 10, which includes four stages, designated erspectively by the numerals 12, 14, 16 and 18. In the interests of simplicity and clarity the circuit will be described from the signal output stage working back to the signal input stage. Specifically, stage 12 is a grounded emitter amplifier which includes a transistor 20 having a base 22, an emitter 24 and a collector 26. The emitter 24 is grounded via lead 28 to the negative line 30 of the direct current power supply 32, while the collector 26 is connected via the load impedance 34 to the opposite line 36 of the direct current power supply 32. In this illustrative embodiment, the power transistor 20 may be used to switch either alternating or direct current, according to the desired application. It will be appreciated that it is not essential to connect the collector 26 to the line 36 and to the power supply 32 in that the voltage to be switched can be the positive side of power supply 32 through line 36, as well as any external power supply up to any voltage that may be above or below the voltage presented by power supply 32; or it can be an alternating current voltage which will prescribed to the above conditions as long as the voltage source being switched does not exceed the voltage limitations of transistor 20 of stage 12. In this illustrative embodiment the power supply to be switched, which may be a direct current or alternating current source, is connected across the terminals 38, 40.

Provision is made for isolating the stage 12 from the preceding stages 14, 16 and 18. This isolation is attained by diodes 42, 44 which have the requisite polarities for the isolation function. Accordingly, stage 12 sees the power supply 32, but any power supply connected across the terminals 38, 40 is isolated from stages 14, 16 and 18.

Stage 14 includes a transistor 46 which is biased to constantly conduct and to present a low impedance clamp between the base 22 of transistor 20 and ground 30 and a negative bias to transistor 20. This serves to neutralize leakage currents of transistor 20 so that in its non-conduction state, that is, the absence of signal at the input terminals, the load impedance 34 passes extremely minute leakage currents. Further, the derivation of negative bias from the transistor 46 provides for temperature compensation in that as the leakage current in transistor 20 increases in response to a temperature rise, the negative bias derived from transistor 46 increases proportionately to maintain minimum leakage current in the circuit of collector 26 and through the load impedance 34.

Stage 14, aside from providing the low impedance clamp and negatively biasing stage 12, also neutralizes the forward biasing current presented through biasing resistance 50 at junction 52, which in the absence of conduction of stage 14, presents sufficient current to bring stage 12 into conduction. Stated somewhat differently, the current supplied from power supply 32 via the lead 36 and biasing resistance 50 available at the junction 52 is normally sufficient to render transistor 20 conductive when the neutralizing current presented at the junction 52 from the collector 48 of transistor 46 is removed, as by rendering stage 15 non-conductive. Stage 14 will be recognized as being connected in the grounded-emitter configuration. with the emitter 54 of transistor 46 connected to ground 30 via lead 56. The base 58 of transistor 46 is connected to the power supply 32 via lead 36 through the biasing resistance 60 to render stage 14 normally conductive.

Stage 16 will be recognized as being connected in the grounded-emitter configuration and includes a transistor 62 having its emitter 64 connected to ground via lead 66, with the collector 68 thereof connected at junction 70 to the biasing resistance 60 and to the base 58 of stage 14. Transistor 62 is non-conductive normally and is maintained so by a negative bias applied to its base 72 through degenerating resistance 74 which is connected to ground 30.

Stage 18 will be recognized as being connected in the grounded-collector or emitter-follower configuration and includes a transistor 76 having its collector 78 connected to the positive side of the power supply through lead 36 and having its emitter 80 highly degenerated by the relatively high impedance of the degenerating resistance 74 connected between emitter 80 and ground 30. Emitter 80 is also degenerated by the high shunting impedance presented across resistance 74 by the base 72 and the emitter 64 of transistor 62 of stage 16 which is normally non-conductive and effectively provides an infinite impedance to ground shunting the relatively high degenerating resistance 74. To further this degenerating condition, the base 82 of stage 18 is connected to ground via a relatively high impedance biasing resistance 84 which normally supplies a negative bias to transistor 82 of stage 18 to render it non-conductive. Signal is applied to the base 82 of transistor 76 via terminal 86 and ground 30.

In order to facilitate a more thorough understanding of the present invention reference will be made to a typical sequence of operations:

At the input of the signal between terminal 86 and ground 30, stage 18 becomes a very small current amplifier, with relatively no power gain due to its degeneration by resistance 74 at stage 18 and the high shunting impedance presented by transistor 12 of stage 16 at emitter 80. Further this small current amplification of signal presented at base 82 of transistor 76 and amplified thereby, appears at emitter 80 and is presented to base 72 of transistor 62. The signal is reamplified by transistor 62 of stage 16 and appears as a greater current between the emitter 64 and collector 68 of stage 16. This further amplification then presents a lower shunting impedance for transistor 76 of stage 18. This is accomplished by a greater conduction pattern between base 72 of transistor 62 through emitter 64 via lead 66 to ground 30. This then allows stage 18 to go into full conduction which in turn very strongly forward biases stage 16. When stage 16 is strongly forward biased, it produces a low impedance between junction 70 via collector 68, emitter 64 and lead 66 to ground 30. This in turn negatively biases and neutralizes all forward bias currents presented at junction 70 by biasing resistance 60 and renders stage 14 non-conductive. Stated somewhat differently, stage 14 is rendered non-conductive by having the forward bias presented by biasing resistance 60 effectively shunted to ground. Further stage 16 provides an over-ride negative biasing of the base 58 through the low impedance path of transistor 62 through the collector 68, emitter 64 and lead 66 to ground 30, when the base 58 of transistor 46 of stage 14 is negatively biased stage 14 goes into non-conduction. This means that no current is being conducted from junction 52 via collector 48, emitter 54 and lead 56 to ground 30. Non-conduction of stage 14 removes the low impedance shunt of stage 12 and allows this stage to become forward biased via biasing resistance 50 through junction 52 to base 22 of transistor 20. Stage 12 then goes into strong conduction. When stage 12 goes into strong conduction, transistor 20 presents a low impedance from its collector 26 to its emitter 24 which then enables power to be supplied from terminal 40 to terminal 38 via load impedance 34 through lead 28 which is connected from terminal 40 to emitter 24 through transistor 20 to junction 26, 34 where the load impedance 34 is connected to the opposite side of the power to be supplied at terminal 38. Stage 12 is capable of switching from junction 38 to junction 40 either B+ or A.C. and stage 12 is capable of switching from junction 40 to 38 either B— or A.C.

Although the illustrative circuit has been shown with the several stages in the same symmetry and employing transistors of the NPN type, it will be appreciated that by appropriate reversal of the polarity of the direct current voltage source, it is possible to employ transistors of the PNP type. Further, although all the stages have been shown as being of the same symmetry, it is also possible to employ complementary symmetry with very slight modifications.

From the foregoing it will be appreciated that the present circuit produces within its first two stages two Hfe's (forward current amplification factor), the first being extremely small and triggering the second Hfe which in turn avalanches to produce an extremely large current gain of an order exceeding 1,000.

It will be appreciated that the present circuit provides substantial neutralization for the leakage current in the final stage which achieves the switching function. This neutralization is self-compensating as a function of temperature in that as the leakage current in the final stage increases incident to increases in temperature, the negative bias derived from the preceding stage correspondingly increases such as to realize temperature stabilization.

The instant circuit provides virtually instantaneous switching in times of the order of .6 microsecond, and switch-off on the order of 4 microseconds. The circuit is capable of realizing gains of a magnitude in excess of three million.

A latitude of modification, change and substitution is intended in the foregoing disclosure, and in some instances some features of the invention will be employed without a corresponding use of other features. Accordingly it is appropriate that the appended claims be construed broadly and in a manner consistent with the spirit and scope of the invention herein.

What we claim is:

1. A power switching device comprising first and second transistor stages each including a base, an emitter and a collector, a source of direct current potential, means connecting the collector of said first stage to one side of said source, means including a degenerating impedance connecting the emitter of said first stage to the other side of said source, means including a biasing resistance connecting the base of said first stage to the other side of said source, signal input means connected to said base and to said other side of said source, means including a biasing resistance connecting the collector of said second stage to said one side of said source, means connecting the emitter of said second stage to said other side of said source, and means connecting the base of said second stage to said emitter of said first stage such that said second stage provides an infinitely high impedance shunting said degenerating impedance signal input to said first stage at said signal input means initially causing a light conduction and then causing an avalanche effect bringing about heavy conduction in the emitter-collector current of said second stage, and switching means responsive only to said heavy conduction, said switching means including a third transistor having an emitter, collector and base, means connected to said base for biasing said third transistor for forward conduction, means for grounding one of the emitter and collector of said third transistor means for connecting a load between the ungrounded one of said emitter and collector and a source of power to be switched, and means connected to said base of said third transistor and to the biasing means for providing a low impedance clamp to ground for said base for neutralizing the forward bias from the biasing means and for neutralizing leakage current in said load.

2. A power switching device comprising first and second transistor stages each including a base, an emitter and a collector, a source of direct current potential, means connecting the collector of said first stage to one side of said source, means including a degenerating impedance connecting the emitter of said first stage to the other side of said source, means including a biasing resistance connecting the base of said first stage to the other side of said source, signal input means connected to said base and to said other side of said source, means including a biasing resistance connecting the collector of said second stage to said one side of said source, means connecting the emitter of said second stage to said other side of said source, and means connecting the base of said second stage to said emitter of said first stage such that said second stage provides an infinitely high impedance shunting said degenerating impedance, signal input to said first stage at said signal input means initially causing a light conduction and then causing an avalanche effect bringing about heavy conduction in the emitter-collector current of said second stage, and switching means responsive only to said heavy conduction, said switching means including a normally conductive transistor amplifier connected in the grounded emitter configuration and including a third transistor having an emitter, collector and base, means including a biasing resistance connected to said base of said third transistor for forward conduction, means for grounding one of the emitter and collector of said third transistor, a source of power to be switched, a load connected between the ungrounded one of said emitter and collector of said third transistor and said source of power, and means connected to said base of said third transistor and to the biasing means for providing a low impedance clamp to ground for said base to neutralize the forward bias from the biasing means and to neutralize leakage current in said load, said last named means including a normally conductive fourth transistor having an emitter, collector and base connected in the grounded emitter configuration, means connecting the collector of said fourth transistor to the junction of the biasing resistance and base of said third transistor, and means including a biasing resistance connected to the base of said fourth transistor for biasing said fourth transistor for forward conduction in an amount sufficient to produce a collector current, at said junction to neutralize the forward bias for said third transistor and to neutralize leakage current in said load.

3. A power switching device comprising first and second transistor stages, a source of direct current potential, means connecting said first transistor stage to said direct current potential and to said second transistor stage for first providing a light conduction and then causing an avalanche effect bringing about heavy conduction for said second transistor stage, switching means responsive to said heavy conduction only, said switching means including a third transistor amplifier connected in the grounded emitter configuration of said second transistor stage and including a transistor having an emitter, collector and base, means including a first biasing resistance connected to said base for biasing said third transistor for forward conduction, means for grounding one of the emitter and collector, a source of power to be switched, a load connected between the ungrounded one of said emitter and collector and said source of power, and means connected to said base and to the biasing means for providing a lower impedance clamp to ground for said base to neutralize the forward bias from the biasing means and for neutralizing leakage current in said load, said last named means including a normally conductive fourth transistor having an emitter, collector and base connected in the grounded emitter configuration, means connecting the collector of said second transistor to the junction of the biasing resistance and base of said third transistor, and means including a second biasing resistance connected to the base of said fourth transistor for biasing said fourth transistor for forward conduction in an amount sufficient to produce a collector current to neutralize the forward bias for said third transistor and to neutralize leakage current in said load.

4. A power switching device comprising first and second transistor stages each including a base, an emitter and a collector, a source of direct current potential, means connecting the collector of said first stage to one side of said source, means including a degenerating impedance connecting the emitter of said first stage to the other side of said source, means including a biasing resistance connecting the first stage of said base to the other side of said source, signal input means connected to said base and to said other side of said source, means including a biasing resistance connecting the collector of said second stage to said one side of said source, means connecting the emitter of said second stage to said other side of said source, and means connecting the base of said second stage to said emitter of said first stage such that said second stage provides an infinitely high impedance shunting said degenerating impedance signal input to said first stage at said signal input means initially causing a light conduction and then causing an avalanche effect bringing about heavy conduction in the emitter-collector circuit of said second stage, and switching means responsive only to said heavy conduction, a source of power to be switched, said switching means including third and fourth transistor stages connected to said emitter-collector circuit and to said source of power to be switched to neutralize direct application of said source of direct current potential on said source of power to be switched.

References Cited in the file of this patent

UNITED STATES PATENTS

| | | |
|---|---|---|
| 2,808,990 | Allen | Oct. 1, 1957 |
| 2,829,281 | Overbeek | Apr. 1, 1958 |
| 2,891,172 | Bruce et al. | June 16, 1959 |